United States Patent
Mehr et al.

(10) Patent No.: US 8,957,404 B2
(45) Date of Patent: Feb. 17, 2015

(54) P-TYPE GRAPHENE BASE TRANSISTOR

(71) Applicant: IHP GmbH-Innovations for High Performance Microelectronics, Frankfurt (DE)

(72) Inventors: Wolfgang Mehr, Friedersdorf (DE); Jaroslaw Dabrowski, Frankfurt (DE); Max Lemme, Hagen (DE); Gunther Lippert, Frankfurt (DE); Grzegorz Lupina, Berlin (DE); Johann Christoph Scheytt, Frankfurt (DE)

(73) Assignee: IHP GmbH—Innovations for High Performance Microelectronics, Frankfurt (DE)

( * ) Notice: Subject to any disclaimer, the term of this patent is extended or adjusted under 35 U.S.C. 154(b) by 0 days.

(21) Appl. No.: 13/721,360

(22) Filed: Dec. 20, 2012

(65) Prior Publication Data
US 2014/0027715 A1    Jan. 30, 2014

(30) Foreign Application Priority Data

Dec. 23, 2011  (EP) .................................. 11195711
Jan. 17, 2012  (EP) .................................. 12151452
Mar. 16, 2012  (EP) .................................. 12159996

(51) Int. Cl.
*H01L 29/872*  (2006.01)
*H01L 29/73*   (2006.01)
*H01L 29/267*  (2006.01)
*H01L 29/40*   (2006.01)
*H01L 29/76*   (2006.01)
*H01L 29/16*   (2006.01)
*H01L 29/165*  (2006.01)

(52) U.S. Cl.
CPC .......... *H01L 29/7317* (2013.01); *H01L 29/267* (2013.01); *H01L 29/402* (2013.01); *H01L 29/7606* (2013.01); *H01L 29/1606* (2013.01); *H01L 29/165* (2013.01)
USPC ..................... 257/26; 257/E29.338

(58) Field of Classification Search
CPC .................................................... H01L 29/1606
USPC ............................................. 257/26, 29, 593
See application file for complete search history.

(56) References Cited

U.S. PATENT DOCUMENTS

| | | | |
|---|---|---|---|
| 2011/0309335 A1* | 12/2011 | Mehr et al. ........................ | 257/26 |
| 2012/0068157 A1* | 3/2012 | Kub .................................. | 257/15 |
| 2012/0292596 A1* | 11/2012 | Dabrowski et al. .............. | 257/29 |

FOREIGN PATENT DOCUMENTS

WO    2010/072590    7/2010

* cited by examiner

*Primary Examiner* — Roy Potter
*Assistant Examiner* — Paul Patton
(74) *Attorney, Agent, or Firm* — Ware, Fressola, Maguire & Barber LLP

(57) ABSTRACT

A hot hole transistor with a graphene base comprises on a substrate an emitter layer, a collector layer, and a base layer that comprises a graphene layer, wherein an emitter barrier layer is arranged between the base layer and the emitter layer, and a collector barrier layer is arranged between the base and the collector layers and adjacent to the graphene layer.

16 Claims, 3 Drawing Sheets

P-TYPE GRAPHENE BASE TRANSISTOR

CROSS-REFERENCE TO RELATED APPLICATIONS

This application claims priority under 35 USC §119 to European Patent Application No. 11 195 711.4 filed on Dec. 23, 2011, European Patent Application No. 12 151 452.5 filed on Jan. 17, 2012 and European Patent Application No. 12 159 996.3 filed on Mar. 16, 2012, which applications are hereby incorporated by reference.

TECHNICAL FIELD

The present invention relates to a graphene hot hole transistor, comprising an emitter layer, a collector layer, and a base layer that comprises a graphene layer, wherein an emitter barrier layer is arranged between the base layer and the emitter layer, and a collector barrier layer is arranged between the base and the collector.

BACKGROUND OF THE INVENTION

Carbon-based materials are considered as having a great potential to improve digital and radio frequency (RF) electronics. Graphene is a name given to a single layer of carbon atoms arranged in a honeycomb lattice, although also films built of few graphene sheets stacked one upon another are often referred to as graphene (or few-layer graphene) and shall also be considered as embodiments of a graphene layer herein. Single-layer graphene is a zero band gap semiconductor with outstanding material properties, such as charge carrier mobility of around $1.2 \times 10^5$ cm$^2$/Vs at 240 K, high field electron velocity of $4 \times 10^7$ cm/s, sheet resistance as low as 125 $\Omega$/sq (about 30 $\Omega$/sq for four-layer films), and thickness of only 0.34 nm.

Most of the work on graphene devices has been so far devoted to field-effect transistors with graphene channel (GFETs). These transistors use single-layer graphene, because field effect in thicker films is hampered by screening, which strongly reduces the transconductance.

Although the realization of a logic switch based on GFET is hindered by the lack of band gap in graphene, this material may have a great potential for RF applications. This field of graphene research has recently attracted a great interest of physicist and device engineering community and resulted in realization of RF graphene field effect transistors (GFET) with cut off frequency (fT) of 100 GHz, ambipolar graphene RF mixers, and graphene frequency multipliers. A high-performance RF (radio frequency) junction transistor is known from WO 2010/072590. Control of operation of such a transistor is performed by driving a tunnel junction, which allows a flow of electrons in one direction when subjected to an operation voltage.

SUMMARY OF THE INVENTION

Still, there is a need for a graphene base transistor that is based on a hole current. Furthermore, there is a need for graphene-based complementary electronic circuits, for instance in the form of logic circuits.

According to the present invention, a graphene hot hole transistor is provided, comprising a layer stack including an emitter layer, a collector layer, and a base layer that comprises a graphene layer, wherein the layer stack further comprises an emitter barrier layer that is arranged between the base layer and the emitter layer, and a collector barrier layer that is arranged between the base and the collector layers and adjacent to the graphene layer;

either the emitter and collector layers are made of a material having p-type conductivity, or the emitter layer is made of a material having p-type conductivity and the collector layer is made of a material having the electrical conductivity of a metal; and wherein the layer stack is configured to allow a current of holes through the layer stack in a stacking direction pointing from the emitter layer through the base layer to the collector layer, under application of an input voltage that sets a base potential at the base layer below an emitter potential at the emitter layer and that sets a collector potential at the collector layer below the base potential, wherein an amount of said current of holes is controllable by an amount of a potential difference between the base potential and the emitter potential.

The graphene hot hole transistor of the present invention may also be called a p-type graphene base transistor, or p-GBT. It allows implementing static complementary logic circuits in analogy to CMOS static logic with complementary p-type and n-type GBTs. Such circuits achieve an increased logic speed compared to CMOS or TTL logic circuits.

Furthermore, reduced static power dissipation is achieved compared to current-mode logic.

The transistor of the present invention has low parasitics. It exhibits an excellent switching behaviour, that is, it switches particularly fast and allows switching large current amounts. In comparison with PMOS transistors in CMOS technologies, equal switching speed can be achieved, but even at higher voltages. In particular, higher collector-base voltages can be applied during operation.

Further advantages of the transistor are a very low off current ($I_{out}$) and a low energy consumption.

It is noted that the stacking direction defined by the transistor layer stack is a direction that is perpendicular to respective planes defined by the individual layers of the stack. Thus, the transistor of the present invention differs in its concept from known graphene field effect transistor structures, which are operated by controlling an in-plane current, while the transistor of the present invention is operated by controlling a current in a direction perpendicular to the layer planes, that is, a current crossing the different layers of the layer stack.

In other words, in the p-type graphene base transistor (GBT) of the present invention, graphene is not used as a high mobility channel as in a field-effect device, but instead as an extremely thin, low resistivity electrode, which controls the collector current. The p-GBT of the present invention thus combines the concept of a hot hole transistor with the unique properties of graphene.

In the following, embodiments of the graphene hot hole transistor of the present invention will be described. The additional features of different embodiments mentioned herein are suited to be combined with each other in order to form further embodiments.

A transistor in accordance with the present invention may have a base layer that consists of the graphene layer only, which in one embodiment has a thickness as low as one atomic layer. Since the hot hole transistor concept of the present invention does not rely on the electric field effect, a graphene sheet used in a base layer of the GBT may in principle contain several carbon sheets. The ultimate thickness of graphene sheet will be a compromise between the graphene deposition technique and the quantum transmission coefficient for electrons travelling across the sheet.

In the following, we will turn to material choices for the emitter barrier layer and the collector barrier layer.

With a view to a desired ease of processing, $SiO_2$ can be used for both barrier layers. However, other material choices provide optimized performance in certain aspects, as will be explained in the following.

The concentration of p-type charge carriers (holes) in the emitter electrode should be as high as possible, because the collector current is proportional to this concentration. Thus a high concentration of holes it enables a high collector current. We note that a p-doped semiconductor is not a necessary requirement here, because holes contribute also to the conductivity of some metals (e.g., Ni), and in some cases hole conductivity dominates in a metal (e.g., in CuS).

The Fermi energy of the emitter is preferably well below the energy of the Dirac point (neutrality point, NP) of graphene. The larger this energy distance, the higher is the quantum transparency of graphene to electrons at emitter-base voltages that are still below the emitter-base insulator (EBI) breakdown voltage.

In the transistor structure of the present invention, the emitter barrier layer is preferably configured to block a hole transport between the emitter layer and the base layer under application of an emitter-base voltage having an amount below a threshold amount, and to allow holes passing the emitter barrier layer between the emitter and the base under an application of an emitter-base voltage above the threshold amount between the emitter and the base. The transport mechanism at the emitter barrier layer is preferably a tunneling transport.

The tunneling barrier formed by the emitter barrier layer may be optionally adjusted by functionalization of the interface between the emitter and the EBI. By functionalization it is understood in the context of the present application that the relative energy position of energy bands in two adjoining materials is changed by an electrical dipole moment, which may for instance be produced by foreign atoms or molecules incorporated into the interface, that is, directly at the interface or in regions near the interface.

The emitter barrier layer, herein also referred to as the emitter-base insulator (EBI), preferably has a thickness of between 1 monoatomic layer and 30 nanometer. In one embodiment, the emitter barrier layer comprises between 1 and 50 monolayers of a dielectric material arranged adjacent to the graphene layer.

Generally, the Fermi energy level of the emitter should be close to the valence band top of the EBI. Here, "close to" means a small fraction of 1 eV, such as 0.2 eV. If this energy difference is positive (the Fermi level is above the EBI valence band top), it measures the EBI tunnel barrier height, which should be low in order to achieve a high collector current and a high transconductance, and, in consequence a high cut-off frequency of the device. On the other hand, if the mentioned energy difference is negative, the energy barrier still may occur at small emitter-basis biases, due to a work function difference between graphene and the emitter material. Both cases can be used for the p-GBT of the present invention in alternative embodiments, as described further below.

A barrier strength of the emitter barrier layer, measured as the product of energy difference defining the tunnel barrier height, the tunneling distance, and of the effective mass of the tunneling hole is preferably low, for the same reason as given in the last paragraph.

The conduction band minimum of the EBI is preferably sufficiently far above the Dirac point so as to avoid leakage of electrons from the graphene base to the emitter when the transistor is switched off. The exact meaning of "sufficiently far" depends on the EBI material chosen and on the EBI thickness.

The EBI and BCI valence band maxima are in one embodiment well aligned at least in the vicinity of the graphene base layer; preferably, the BCI valence band maximum is at or below the EBI valence band maximum. This allows keeping the base current component due to electrons inelastically scattered inside the BCI low. The relative position of the above-mentioned valence band maxima depends on the selection of materials for the EBI and for the BCI and may be further adjusted by optional functionalization of the interface between the base and the BCI.

The emitter barrier layer may for instance be a dielectric material, in particular an oxide of B, Si, Ge. In another embodiment, the emitter barrier layer is made of a nitride of B, Si, or Ge. In another embodiment, the emitter barrier layer is made of a chalcogenide (selenide, sulfide, or telluride) of B, Si, Sn, Cd, or Ge, or of molybdenum disulfide. The interface between the emitter and the EBI may optionally be functionalized.

On the other side, the collector barrier layer is preferably configured to avoid a current of holes between the base layer and the collector layer in absence of a hole injection from the emitter layer into the base layer.

The collector barrier layer, herein also referred to as base-collector insulator (BCI) typically comprises a dielectric layer at an interface between the base layer and the collector. The interface between the base and the BCI may optionally be functionalized. In a variant, which is particularly suitable for transistor variants enabling high-power operation, the collector barrier layer further comprises a compositionally graded layer made of a dielectric material and arranged adjacent to the dielectric layer. A compositionally graded material is to be understood as a composite material, in the present context a layer of a solid-state material, which may be defined by at least two material components that assume defined fractions of a unit quantity of the composite material. All fractions add up to 100%, but the fractions of the individual components change as a function of position in a certain direction. In the present case, the direction points from the base layer to the collector layer. Non-restrictive examples of a compositionally graded material layer form a mixture or an alloy.

Generally, the compositionally graded layer may have a thickness of up to 500 nanometer. However, it is preferred that the compositionally graded layer has a thickness of up to 90 nanometer. By providing a collector barrier layer, in which an energy-barrier for holes in their motion from the graphene layer towards the collector layer decreases with increasing distance from the base, the transistor of the present embodiment allows achieving a high collector current, low base currents and—in some embodiments—a high output power. An energy barrier is defined by the profile of the upper edge of the valence band as a function of position across the graphene layer and the collector barrier layer. In particular, the energy barrier of the transistor of this embodiment provides a high transparency to holes when an operating voltage is applied to the transistor, and allows avoiding the formation of a tunneling barrier for holes, and, at least to a large extent, the occurrence of quantum reflection at the interface between the graphene layer and the collector barrier layer.

The dielectric layer of the collector barrier layer is for instance made of a material selected from the group of $SiO_2$, BN, molybdenum disulfide, and any chalcogenides. The BCI may form a layer structure comprising at least two layers made of different ones of these materials. Boron nitride has shown a potential for providing a particularly suitable substrate for the fabrication of a graphene layer. At the same time, BN, in particular hexagonal BN (hBN) provides advantageous properties as a dielectric. For it is a suitable substrate for the fabrication of graphene. Furthermore, hBN can be fabricated as a very thin, few-layer or even mono-atomic layer. Preferably, BN is provided with a thickness of between 1 and 10 monolayers.

In the graphene hot hole transistor either the emitter layer or both the collector and emitter layer are in some embodiments made of p-doped silicon. To support high currents in the tunneling regime, in preferred embodiments the emitter barrier layer forms a rather low tunneling barrier, preferably in the range of 0.5 eV or less. Such an optimization of the barrier shape helps to achieve a good transconductance at the working point of the transistor, and at the same time maintain the base current sufficiently low.

The collector layer may either also be made of a p-conductive material, such as p-doped silicon. However, in an alternative embodiment it is made of a metal.

In the following, various embodiments employing different suitable materials for a high-power p-GBT are discussed.

A requirement specific for a high-power p-GBT is that the BCI must withstand voltages of the order of at least several Volts. To this end, a material having a band gap that is several eV wide is preferably used for the BCI.

In one embodiment having a compositionally graded BCI, this material with a band gap of several eV is present only in that part of the BCI, in which the electric field is high. That is, it is present only in that part of the BCI, in which the dielectric constant is low in comparison with the rest of the BCI. In that part, which has a higher dielectric constant, i.e., where the electric field will be low, the band gap may be of the order of one eV. Thus, intrinsic silicon may be used here.

If high output power is desired, BCI materials with a wide band gap are of advantage, because they can sustain higher electric fields without being damaged. "Wide band gap" means here "about 6 eV, and preferably even more". Since the conduction band minimum of typical materials is about 1 to 4 eV below the vacuum level, the wide band gap requirement corresponds to the requirement that the valence band maximum is about 7 to 10 eV below the vacuum level. Many materials of interest, including hBN, $TiO_2$ and $HfO_2$, have their valence band maximum between 7 and 8 eV below vacuum. $SiO_2$ has it at about 10 eV.

Generally, a low EBI energy barrier is advantageous. Furthermore, it is preferred that the EBI and BCI energy barriers are equal. In combination with the above considerations of the previous paragraphs, the requirements of these embodiments place additional constraints on the selection of the emitter material. This constraint is of particular meaning, if the BCI is not graded, because it means that the emitter Fermi level should be at least as deep as nearly 7 eV below the vacuum energy level. Usually, metals have work functions of less than 6 eV, and p-type doping of wide gap semiconductors that could provide holes at these energies is difficult. One materials solution that fulfils the requirements is: p-doped hexagonal boron nitride (h-BN) for the emitter, undoped hBN for the EBI, graphene for the base, undoped BN for the BCI, and a metallic collector.

It is noted that there are less constraints on the collector material Thus, the collector material can be selected more freely. Materials suitable for the collector in this regard are Ni or p-Si. In view of reliability issues, it is preferred that the energy barrier formed by the BCI is rather low. The lower the barrier the longer is the expected life time of the transistor.

The highest p-type doping reported so far for BN is $10^{18}$ $cm^{-3}$, achieved with Mg doping of MOCVD hBN. An exemplary embodiment further increasing the hole concentration in the emitter further comprises a metallic back-gate layer separated from the emitter by a back-gate insulator layer, and a bias contact for applying a DC bias to a capacitor formed by the emitter, the back-gate insulator layer and the back-gate layer. The transistor is configured to allow application of a static (DC) bias ($V_{GE}$) to the capacitor formed by the emitter, the back gate insulator (BGI) and the metallic back-gate layer. If it is desired to achieve a high enough hole concentration in the emitter, a suitable high-k dielectric, e.g., $HfO_2$, $TiO_2$ or a material with even higher dielectric constant should be used for the back-gate insulator layer. In operation, the back gate is preferably negatively biased with respect to the emitter. This bias is used in the present embodiment to induce an increased p-type carrier concentration in the emitter by a field effect. In alternative embodiments, the dielectric of the backgate-insulator layer is $SiO_2$ or, if it is necessary to achieve a particularly high hole concentration in the emitter, a suitable high-k dielectric, e.g., $HfO_2$, $TiO_2$ or a material with even higher dielectric constant.

Another example of materials solution uses a graded BCI dielectric, wherein the compositional grading varies between a first BCI region close to the graphene gate with a narrower band gap and a second BCI region close to the collector with a band gap wider than in the first BCI region. This embodiment allows a proper alignment of the BCI and EBI valence band maxima.

The BCI dielectric constant in the first BCI region closer to the graphene base is preferably higher (narrower band gap) than in the second BCI region closer to the collector (higher band gap).

This solution forces the electric field into the wide band gap part of the BCI, i.e., into the part that has a higher dielectric strength and accordingly allows the application of higher base-collector biases, as needed to achieve a higher output power.

This part can be made, for example, of $SiO_2$, or $Si_3N_4$, or BN.

The emitter-EBI solution can in this case be similar to that proposed further below for a low-power p-GBT.

Yet another embodiment implements a materials solution that relaxes the EBI barrier problem by allowing a nominally high difference between the emitter work function and the EBI valence band but assuring a sufficiently high emitter current by using an extremely thin EBI layer. In one variant of this embodiment, a layered dielectric material is used for the EBI, such as hBN; a single hBN layer is an insulating analogue of graphene. In addition, the energy barrier for quantum tunneling across a monolayer hBN is significantly reduced by the Schottky effect (image force). This effect makes the emitter current high enough when a metal emitter is used. By a "layered material" we mean here a material composed of weakly bonded layers, like graphite, mica or hexagonal BN (hBN).

In the following, various embodiments of a low-power p-GBT are proposed.

In a low-power p-GBT, there is no need for the BCI to withstand high base-collector biases ($V_{BC}$). Therefore, the physical constraint that the BCI work function be high is relaxed, so that one can select the material used for the EBI and BCI layers in such a way that the valence band is only a small fraction of eV above a metal emitter. The EBI may be substantially thicker than a monolayer of atoms. E.g., it may be a few nm thick.

A specific example of materials solution for low-power p-GBT with metal emitter is: Ni for the emitter, and InN for the EBI and CBI insulators layers. The Fermi surface of Ni has a hole pocket, the work function of Ni is 5.3 eV, and the work function of p-type InN (the position of valence band top with respect to vacuum) is about 5.6 eV, so that the EBI barrier of the order of 0.3 eV may be achieved.

Another example uses p-type semiconducting emitter. For ease of processing, p-type Si for the emitter, intrinsic Si for the EBI and for the BCI may be selected. This embodiment of a low-power p-GBT is advantageous in particular because of its compatibility with highly developed and standardized CMOS processing.

A layer sub-stack of the layer stack, the layer sub-stack being formed by the emitter layer and the emitter barrier layer, is thus preferably formed by a $p^{++}$-Si(001)/i-Si(001) layer sub-stack, a $p^{++}$-Ge(001)/i-Ge(001) layer sub-stack. As an alternative, a $p^{++}$-GaAs(001)/i-GaAs(001) layer stack may be used.

The graphene hot hole transistor can be implemented as a stand-alone component or as a component of an integrated circuit.

A preferred embodiment of an electronic component is a complementary electronic circuit comprising a graphene hot hole transistor according to the present invention and a graphene hot electron transistor.

The graphene hot electron transistor of the complementary electronic circuit preferably includes
  a second layer stack comprising a second emitter layer, a second collector layer, and a second base layer that comprises a second graphene layer, wherein
  the second layer stack further comprises a second emitter barrier layer that is arranged between the second base layer and the second emitter layer, and a second collector barrier layer that is arranged between the second base and the second collector layers and adjacent to the second graphene layer,
  either the second emitter and second collector layers are made of a material having n-type conductivity, or the second emitter layer is made of a material having n-type conductivity and the collector layer is made of a material having the electrical conductivity of a metal; and wherein
  the second layer stack is configured to allow an electron current through the layer stack in a stacking direction pointing from the emitter layer through the base layer to the collector layer, under application of an input voltage that sets a base potential at the base layer above an emitter potential at the emitter layer and that sets a collector potential at the collector layer above the base potential, wherein an amount of said current of holes is controllable by an amount of a potential difference between the base potential and the emitter potential.
The second emitter layer may made of n-doped silicon.

BRIEF DESCRIPTION OF THE DRAWINGS

In the following, additional embodiments will be described with reference to the Figures.

DETAILED DESCRIPTION

Figure 1:
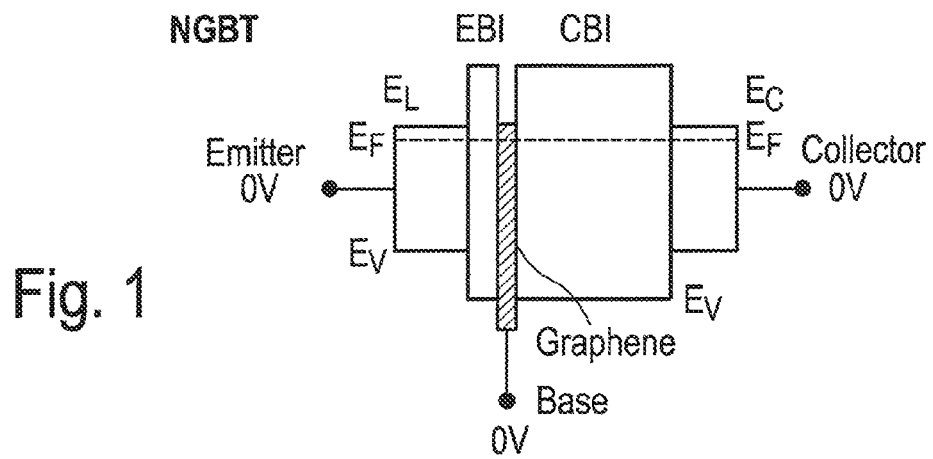
FIG. 1 shows a schematic band structure of a graphene hot electron transistor as a function of position along a depth direction in absence of an operating voltage.
Figure 2:
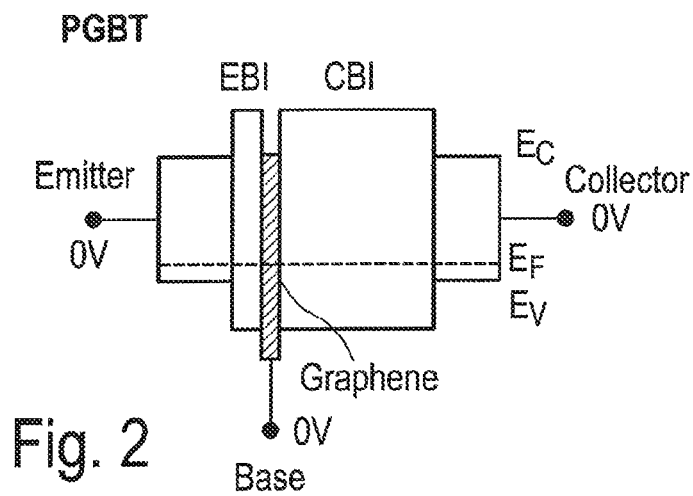
FIG. 2 shows a schematic band structure of a graphene hot hole transistor as a function of position along a depth direction in absence of an operating voltage.
Figure 6:
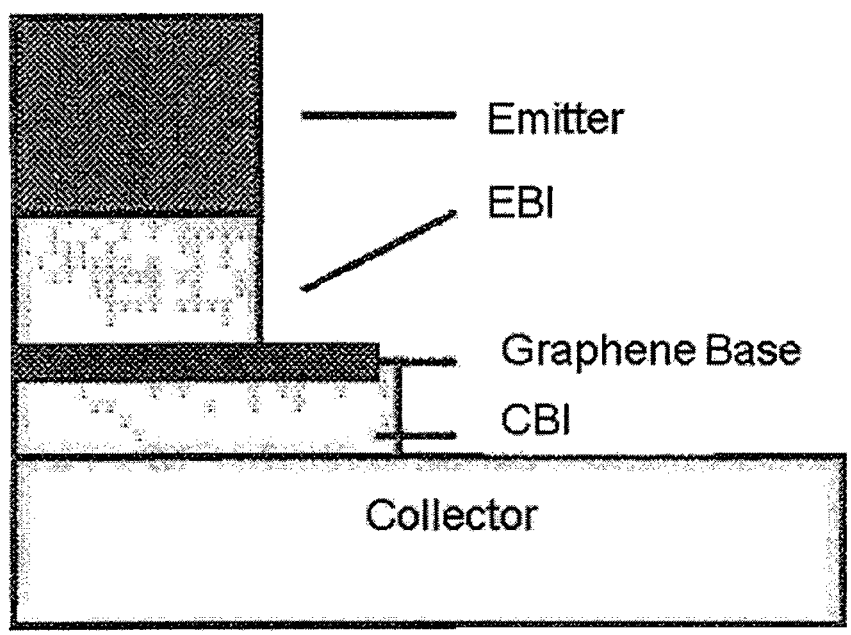
FIG. 6 shows a schematic cross-sectional view of a p-GBT.

FIGS. 1 and 2 show a schematic band structure of a graphene hot electron transistor (FIG. 1) and a hot hole transistor (FIG. 2) as a function of position along a depth direction in absence of an operating voltage. Reference is made in parallel to FIG. 6, which shows a schematic cross-sectional view of a p-GBT implementing the band structure profile of FIG. 6. The device concept of the n-GBT transistor of FIG. 1 and the p-GBT transistor 2 is based on a vertical arrangement of the transistor electrodes emitter, base, and collector.

From an electrical point of view, the devices of FIGS. 1 and 2 work similarly to the hot electron/hot hole transistor and also to the heterojunction bipolar transistor, or simply to a vacuum triode.

Turning to the hot hole transistor (labelled PGBT) of FIGS. 2 and 6, an emitter-base diode acts as a hole emitter injecting hot holes across the base layer (graphene) into the valence band of the collector barrier layer, which takes the form of an insulating layer placed between the base and the collector and in the following will also be referred to in short as BCI or BCI layer. The holes leave the emitter for instance by Fowler-Nordheim quantum tunneling through an emitter barrier layer, which is also referred to as emitter-base insulator, EBI layer or EBI.

A specific example of materials for a low-power p-GBT with metal emitter is: Ni for the emitter, and InN for the EBI and CBI insulators layers. The Fermi surface of Ni has a hole pocket, the work function of Ni is 5.3 eV, and the work function of p-type InN (the position of valence band top with respect to vacuum) is about 5.6 eV, so that the EBI barrier of the order of 0.3 eV may be achieved.

Another example uses p-type semiconducting emitter. For ease of processing, p-type Si for the emitter, intrinsic Si for the EBI and for the BCI may be selected. This embodiment of a low-power p-GBT is advantageous in particular because of its compatibility with highly developed and standardized CMOS processing.

In one embodiment, the materials of EBI and CBI are selected to provide different valence band offsets.

The BCI can be much thicker than the EBI, so that it may receive a sufficiently high collector voltage. The graphene base works as the control electrode (grid in a vacuum tube). Ballistic transport across the base is expected, so the transparency is limited only by quantum effects. At the same time, the base resistance is very low, despite its extremely small thickness: in contrast to ultrathin metal films, graphene covers the insulator in form of a closed sheet, with no pinholes that would increase the resistivity and lateral scattering. This leads to a very high gain and extremely low base current. As argued below, the BCI layer can be designed in such a way that significantly higher voltages can be applied between the base and the collector electrode than it is possible in common transistors based on silicon. This is advantageous for the power performance of the device.

Holes injected from the emitter should be transmitted across the BCI with as small hindrance as possible. In the ideal case, they should cross the BCI in a ballistic process.

Figure 3:
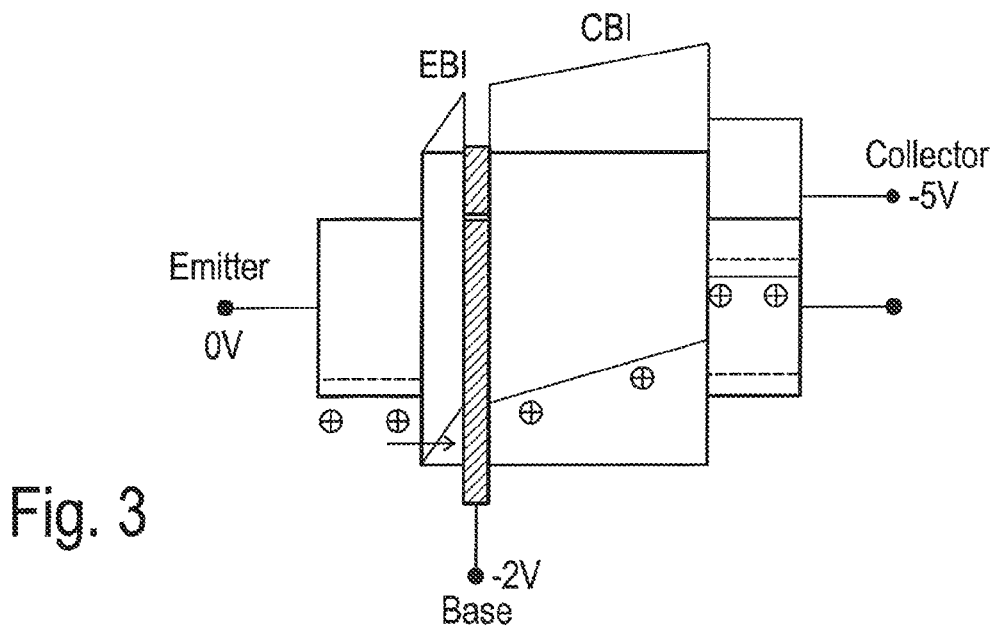
FIG. 3 shows a schematic band structure of a graphene hot hole transistor as a function of position along a depth direction under application of an operating voltage.

FIG. 3 shows a schematic band structure of the graphene hot hole transistor of FIG. 2 as a function of position along a depth direction under application of an operating voltage. Operating voltages of 0V for the emitter, −2 V for the base and −5 V for the collector are given by way example only. Any voltage combination that is able to achieve a similar band structure under operation may be used. In addition to the band structure without application of operating voltages, the induced energy shifts are shown in FIG. 3 as red lines. The Fermi level (indicated by a thin dashed line) on the collector side is shifted to higher energy under application of the collector voltage. Under application of the base voltage and the collector voltage, holes provided in the emitter are able to cross the emitter barrier layer EBI and the graphene base and are transported across the collector barrier layer CBI to the collector.

Figure 4:
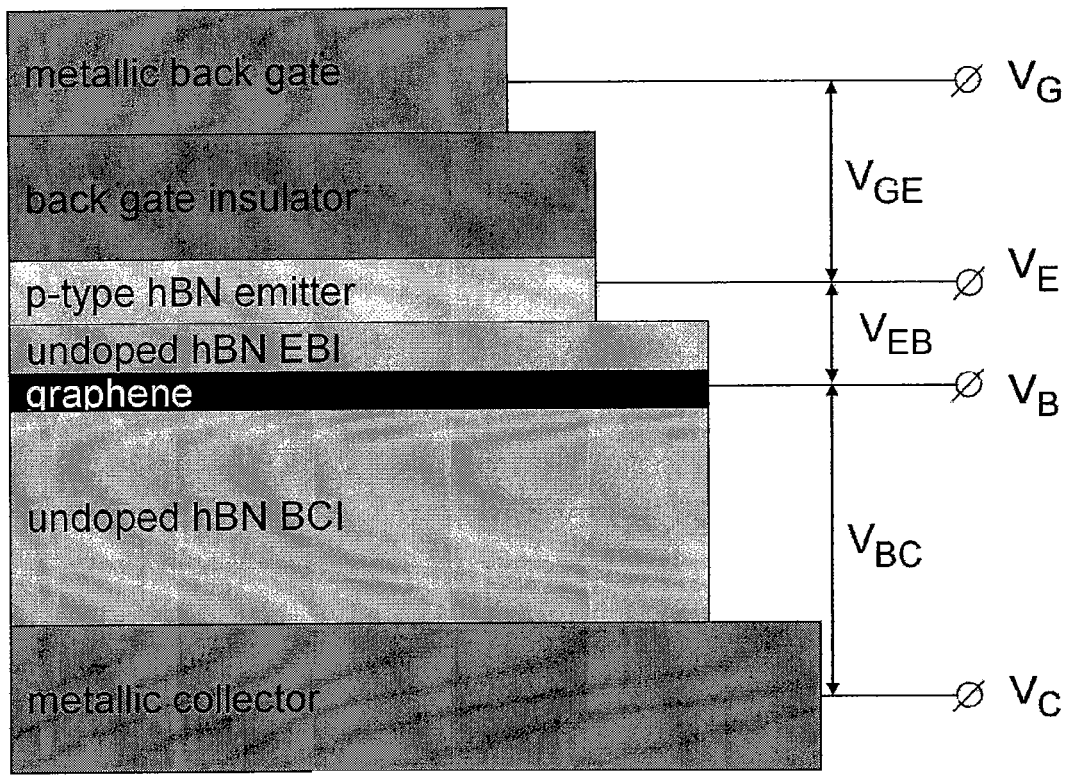
FIG. 4 shows a schematic cross section of an embodiment forming a four-terminal p-GBT.

FIG. 4 shows a schematic cross sectional view of another embodiment of a p-GBT. The p-GBT of FIG. 4 is especially suited for high-power applications. It is a four-terminal device. On a metallic collector, a collector barrier layer BCI is provided, which is made of undoped hexagonal boron nitride (BN). A graphene base layer is formed on the collector barrier layer BCI. The graphene base layer is sandwiched between the collector barrier layer BCI and an emitter barrier layer EBI, which is also mode of undoped hexagonal BN. An emitter made of p-type hexagonal BN is formed on the emitter barrier layer EBI. An additional capacitive control is provided by a back-gate insulator layer on the emitter and a metallic back-gate layer on the back-gate insulator layer.

A static (DC) bias $V_{GE}$ can be applied in operation to the capacitor formed by the p-type emitter, the back gate insulator (BGI) and the metallic back gate contact is. This way an increased p-type carrier concentration is induced in the emitter.

In a variant of this structure, the back gate insulator layer is made of $SiO_2$ or, if it is necessary to achieve a high enough hole concentration in the emitter, a suitable high-k dielectric, e.g., HfO2, TiO2 or a material with even higher dielectric constant. This approach is similar to that used in a Field Effect Transistor (FET), but differs from it substantially in that in the solution described above the $V_{GE}$ bias is constant and the emitter has terminal contacts of only one kind (the emitter contact), while in the FET family the gate bias (corresponding to the back gate bias) is varied during transistor operation and the channel (corresponding to the emitter in the above solution) has two different terminal contacts (source and drain).

Figure 5:
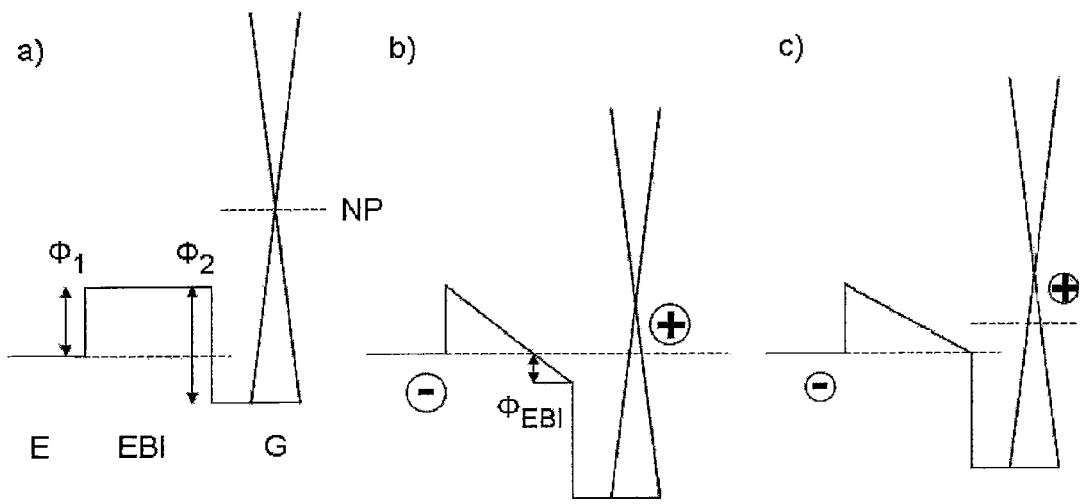
FIG. 5 is a sketch showing EBI barrier formation and control for the case of a nominally negative EBI barrier.

FIG. 5 illustrates the case when the Fermi level of the metal emitter is below the valence band of the EBI (negative nominal EBI barrier $\phi_1$ for holes) and the metal emitter work function is higher than the work function of graphene. A cone shown in the Figure represents the band structure of graphene around the neutrality point (NP), while the nominal energy difference between the EBI valence band top and the Fermi level of the emitter metal (E) is denoted as $\phi_1$ and the energy difference between EBI valence band top and the graphene (G) valence band maximum at $\Gamma$ is denoted as $\phi_2$.

FIG. 5a) shows a band diagram in an imaginary situation right after graphene is placed on top of the EBI and the relative position of graphene and EBI electron states is already equilibrated, but still before the Fermi levels of graphene and the emitter begin to equilibrate. FIG. 5b) shows the situation after the Fermi levels equilibrate. Electrons flow from graphene into the emitter and a sheet negative charge is formed at the emitter-EBI interface, compensated by the positive charge in the graphene. An electric field appears in the EBI, and a tunneling barrier is formed close to the interface between graphene and the EBI. FIG. 5c) represents the case when the graphene base is biased negatively with respect to the emitter. Because of a high carrier density of carriers in the emitter, the negative sheet charge is narrow and does not prevent the holes in the emitter from transversing the structure from the emitter to the graphene, and further to the collector if sufficiently high negative voltage is applied to the collector terminal.

What is claimed is:

1. An electronic component comprising a graphene hot hole transistor comprising:
    a layer stack including an emitter layer, a collector layer, and a base layer that comprises a graphene layer, wherein
    the layer stack further comprises an emitter barrier layer that is arranged between the base layer and the emitter layer, and a collector barrier layer that is arranged between the base and the collector layers and adjacent to the graphene layer;
    either the emitter and collector layers are made of a material having p-type conductivity, or the emitter layer is made of a material having p-type conductivity and the collector layer is made of a material having the electrical conductivity of a metal; and wherein
    the layer stack is configured to allow a current of holes through the layer stack in a stacking direction pointing from the emitter layer through the base layer to the collector layer, under application of an input voltage that sets a base potential at the base layer below an emitter potential at the emitter layer and that sets a collector potential at the collector layer below the base potential, wherein an amount of said current of holes is controllable by an amount of a potential difference between the base potential and the emitter potential.

2. The electronic component of claim 1, wherein either the emitter layer or both the collector and emitter layers of the graphene hot hole transistor are made of p-doped silicon.

3. The electronic component of claim 1, wherein the collector barrier layer of the graphene hot hole transistor comprises a dielectric layer at an interface between the base layer and the collector.

4. The electronic component of claim 1, wherein with respect to the graphene hot hole transistor an interface dipole moment is present either at the interface between the base layer and the collector barrier layer or at an interface between the emitter layer and the emitter barrier layer or at both of these interfaces, and wherein the interface dipole moment modifies an energy position of the valence band maximum in the respective barrier layer, which is formed by either the collector barrier layer or the emitter barrier layer, with respect to the Fermi level of the unbiased graphene hot hole transistor.

5. The electronic component of claim 3, wherein the collector barrier layer of the graphene hot hole transistor further comprises a compositionally graded layer made of a dielectric material and arranged adjacent to the dielectric layer.

6. The electronic component of claim 1, wherein the emitter barrier layer of the graphene hot hole transistor has a thickness of between 1 monoatomic layer and 30 nanometer.

7. The electronic component of claim 5, wherein the compositionally graded layer of the graphene hot hole transistor has a thickness of up to 500 nanometer.

8. The electronic component of claim 7, wherein the compositionally graded layer of the graphene hot hole transistor has a thickness of up to 90 nanometer.

9. The electronic component of claim 1, wherein the dielectric layer of the collector barrier layer of the graphene hot hole transistor is made of $SiO_2$, BN, molybdenum disulfide, a chalcogenide, $TiO_2$ $HfO_2$, intrinsic InN or intrinsic Si or is a layer structure comprising at least two layers made of different ones of these materials.

10. The electronic component of claim 1, wherein the emitter barrier layer of the graphene hot hole transistor comprises between 1 and 50 monolayers of a dielectric material arranged adjacent to the graphene layer.

11. The electronic component of claim 10, wherein the emitter barrier layer of the graphene hot hole transistor is made of a chalcogenide, in particular an oxide a selenide, tellurideor sulfide, of Si, Ge, Sn, or of a nitride of B, In, Si, Ge.

12. The electronic component of claim 1, wherein the emitter of the graphene hot hole transistor is made of p-doped hexagonal boron nitride (h-BN), the emitter barrier layer is made of undoped hBN, the collector barrier layer is made of undoped BN, and the collector is a metal.

13. The electronic component of claim 1, wherein the graphene hot hole transistor further comprises a metallic back gate layer separated from the emitter by a back-gate insulator layer, and a bias contact for applying a DC bias to a capacitor formed by the emitter, the back-gate insulator layer and the back-gate layer.

14. The electronic component of claim 1, wherein a layer sub-stack of the layer stack of the graphene hot hole transistor, the layer sub-stack being formed by the emitter layer and the emitter barrier layer, is formed by a $p^{++}$-Si(001)/i-Si(001) layer sub-stack, a $p^{++}$-Ge(001)/i-Ge(001) layer sub-stack, or a $p^{++}$-GaAs(001)/i-GaAs(001) layer stack.

15. A complementary electronic circuit comprising a graphene hot hole transistor comprising:
   a layer stack including an emitter layer, a collector layer, and a base layer that comprises a graphene layer, wherein
   the layer stack further comprises an emitter barrier layer that is arranged between the base layer and the emitter layer, and a collector barrier layer that is arranged between the base and the collector layers and adjacent to the graphene layer;
   either the emitter and collector layers are made of a material having p-type conductivity, or the emitter layer is made of a material having p-type conductivity and the collector layer is made of a material having the electrical conductivity of a metal; and wherein
   the layer stack is configured to allow a current of holes through the layer stack in a stacking direction pointing from the emitter layer through the base layer to the collector layer, under application of an input voltage that sets a base potential at the base layer below an emitter potential at the emitter layer and that sets a collector potential at the collector layer below the base potential, wherein an amount of said current of holes is controllable by an amount of a potential difference between the base potential and the emitter potential; and
   a graphene hot electron transistor.

16. The complementary electronic circuit of claim 15, wherein the graphene hot electron transistor includes
   a second layer stack comprising a second emitter layer, a second collector layer, and a second base layer that comprises a second graphene layer, wherein
   the second layer stack further comprises a second emitter barrier layer that is arranged between the second base layer and the second emitter layer, and a second collector barrier layer that is arranged between the second base and the second collector layers and adjacent to the second graphene layer,
   either the second emitter and second collector layers are made of a material having n-type conductivity, or the second emitter layer is made of a material having n-type conductivity and the collector layer is made of a material having the electrical conductivity of a metal; and wherein
   the second layer stack is configured to allow an electron current through the layer stack in a stacking direction pointing from the emitter layer through the base layer to the collector layer, under application of an input voltage that sets a base potential at the base layer above an emitter potential at the emitter layer and that sets a collector potential at the collector layer above the base potential, wherein an amount of said current of holes is controllable by an amount of a potential difference between the base potential and the emitter potential.

* * * * *